United States Patent [19]

Kawakami et al.

[11] Patent Number: 5,219,607
[45] Date of Patent: Jun. 15, 1993

[54] METHOD OF MANUFACTURING PRINTED CIRCUIT BOARD

[75] Inventors: Shin Kawakami; Satoshi Haruyama; Hirotaka Okonogi, all of Saitama, Japan

[73] Assignee: Nippon CMK Corp., Japan

[21] Appl. No.: 717,870

[22] Filed: Jun. 12, 1991

Related U.S. Application Data

[63] Continuation of Ser. No. 442,141, Nov. 28, 1989, abandoned.

[30] Foreign Application Priority Data

Nov. 29, 1988 [JP] Japan .................. 63-301780
Nov. 29, 1988 [JP] Japan .................. 63-301781

[51] Int. Cl.⁵ .............................................. C23C 26/00
[52] U.S. Cl. ................................. 427/96; 427/58; 427/126.3
[58] Field of Search ....................... 427/96, 58, 126.3

[56] References Cited

U.S. PATENT DOCUMENTS

| 4,327,124 | 4/1982 | DesMarais | 427/96 |
| 4,454,167 | 6/1984 | Bernot | 427/96 |
| 4,774,634 | 9/1988 | Tate | 29/832 |
| 4,808,434 | 2/1989 | Bennett | 427/96 |
| 4,845,313 | 7/1989 | Endoh | 361/414 |
| 4,861,640 | 8/1989 | Gurd | 427/96 |
| 4,917,466 | 4/1990 | Nakamura | 350/336 |
| 5,100,695 | 3/1992 | Kawakami | 427/96 |

FOREIGN PATENT DOCUMENTS 1-292 3/1989 Japan ..................... 427/96

Primary Examiner—Michael Lusigan
Assistant Examiner—Vi Duong Dang
Attorney, Agent, or Firm—Bruce L. Adams; Van C. Wilks

[57] ABSTRACT

A method of manufacturing a printed circuit comprising the following steps: in a connection portion of a printed circuit formed on an insulating substrate, another circuit portion such as a jumper circuit is applied with resin ink; and a connection circuit for the circuit terminal portion of said printed circuit is formed by applying electroconductive ink.

11 Claims, 3 Drawing Sheets

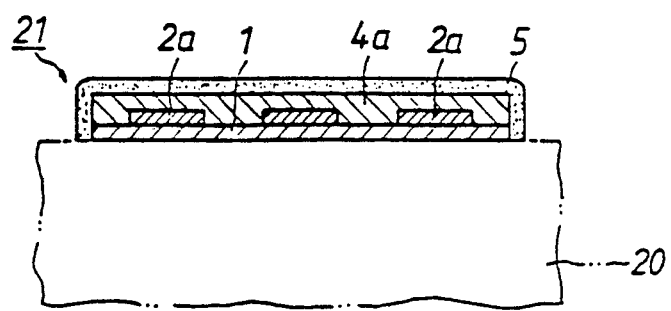
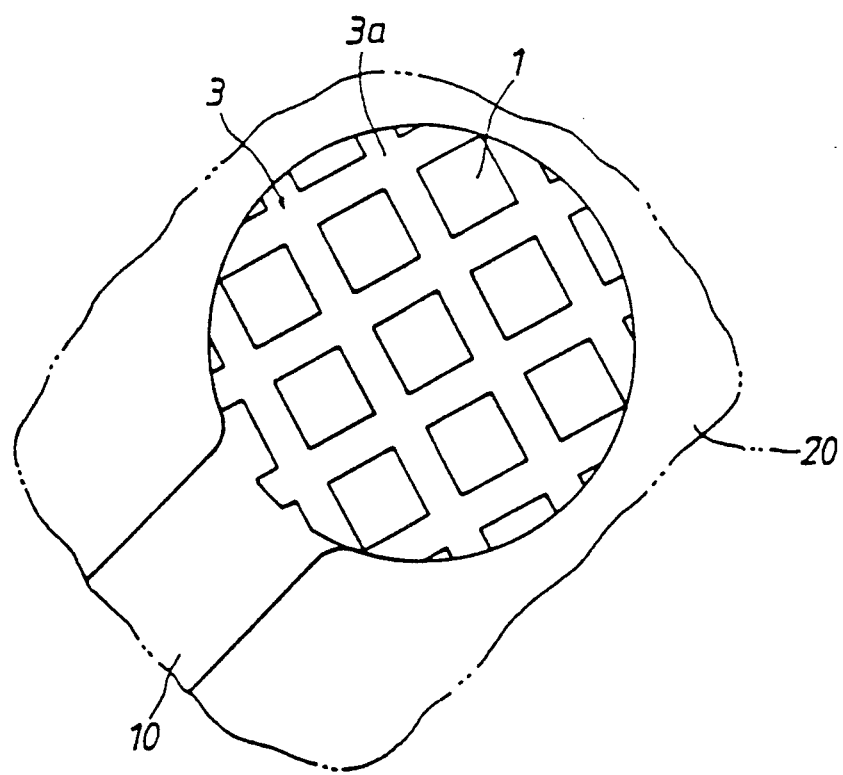

METHOD OF MANUFACTURING PRINTED CIRCUIT BOARD

The is is a continuation of parent application Ser. No. 442,141 filed Nov. 28, 1989, abandoned.

BACKGROUND OF THE INVENTION

1. Field of the Invention

The present invention relates to a method of manufacturing a printed circuit board, and, more particularly to a method of manufacturing a printed circuit board in which a circuit portion such as a jumper circuit is formed by applying electroconductive ink such as copper paste in a connection portion of a printed circuit formed on an insulating substrate.

2. Related Art Statement

Hitherto, conventional printed circuit boards have been manufactured by forming predetermined printed circuits by performing etching of copper foil of so-called copper laminated boards formed by laminating copper foil on insulating substrates in accordance with predetermined layouts of the circuits.

In order to form a circuit such as a jumper circuit disposed between the printed circuits on such printed circuit boards, a manufacturing method, as shown in FIG. 5, has been developed such that a jumper circuit portion 4 structured by electrically connecting a connection terminal portion 4a is formed on a connection terminal portion 1 of a printed circuit 10 by applying and hardening electroconductive ink made of copper paste or other electroconductive paste by silk screen printing or the like. Recently, various types of electroconductive ink which can be advantageously used for forming circuits of the type described above have been developed.

However, when such circuits are formed by applying or performing silk screen printing of electroconductive paste such as copper paste, there arises a problem in terms of contact between the circuit terminal portion 1 in the copper foil on the printed circuit board and the electroconductive paste, that is the electroconductive ink. That is, since such electroconductive paste contains a great quantity of an electroconductive material such as carbon, silver or copper particles mixed in resin ink thereof for the purpose of improving electroconduction, the resin which can assist contact with the surface of the copper foil terminal is considerably reduced. As a result, electroconductive paste lacks sufficient adhesive force for realizing a contact with a metallic surface compared with normal resin ink, causing the electrical connection to become unreliable. In addition, its poor mechanical strength can cause it to peel due to the thermal shock generated when components are soldered.

To this end, an object of the present invention is to provide a method of manufacturing printed circuit boards capable of improving the electrical and mechanical strength required between electroconductive paste and the circuit terminal portion.

SUMMARY OF THE INVENTION

A method of manufacturing a printed circuit board according to the present invention is characterized in that: when a circuit portion to be connected to the printed circuit is formed after the printed circuit has been formed on an insulating substrate and an insulating layer has been applied on part of this printed circuit, a portion of the terminal surface of the circuit terminal portion to be connected with electroconductive ink is, simultaneously with the forming of an insulating layer, covered with resin ink for forming the insulating layer.

With the method of manufacturing printed circuit boards according to the present invention, a coating layer made of resin ink is formed on part of the surface of a terminal portion of the printed circuit on the printed circuit board prior to the forming of the circuit by using electroconductive ink, then this circuit is formed by using this electroconductive ink. Thanks to the compatibility between the coating layer made of resin ink formed on part of the surface of the terminal and the electroconductive ink, an excellent contact can be obtained. Thus, the electrical and mechanical strength of the portion at which the terminal surface and the electroconductive ink are positioned in contact each other can be improved.

In particular, the working efficiency can be improved by simultaneously performing a manufacturing process for applying a coating layer made of resin on part of the terminal surface and a manufacturing process for forming the insulating layer.

BRIEF DESCRIPTION OF THE DRAWINGS

FIGS. 1 and 2 are views which illustrate a first embodiment of the method for manufacturing a printed circuit board according to the present invention, wherein FIG. 1 is an enlarged plan view which illustrates a state in which a multi-dot coating layer of resin ink is formed on the surface of a terminal portion of a printed circuit;

FIG. 2b is a cross-sectional view taken along line A—A of FIG. 2a;

FIGS. 3 and 4 are views which illustrate a second embodiment of a method of manufacturing a printed circuit board according to the present invention, wherein FIG. 3 is an enlarged plan view which illustrates a terminal portion;

FIG. 4b is a cross-sectional view taken along line B—B of FIG. 4a; and

DESCRIPTION OF THE PREFERRED EMBODIMENTS

An embodiment of a method of manufacturing a printed circuit board according to the present invention will be described with reference to the accompanying drawings.

Figure 1:
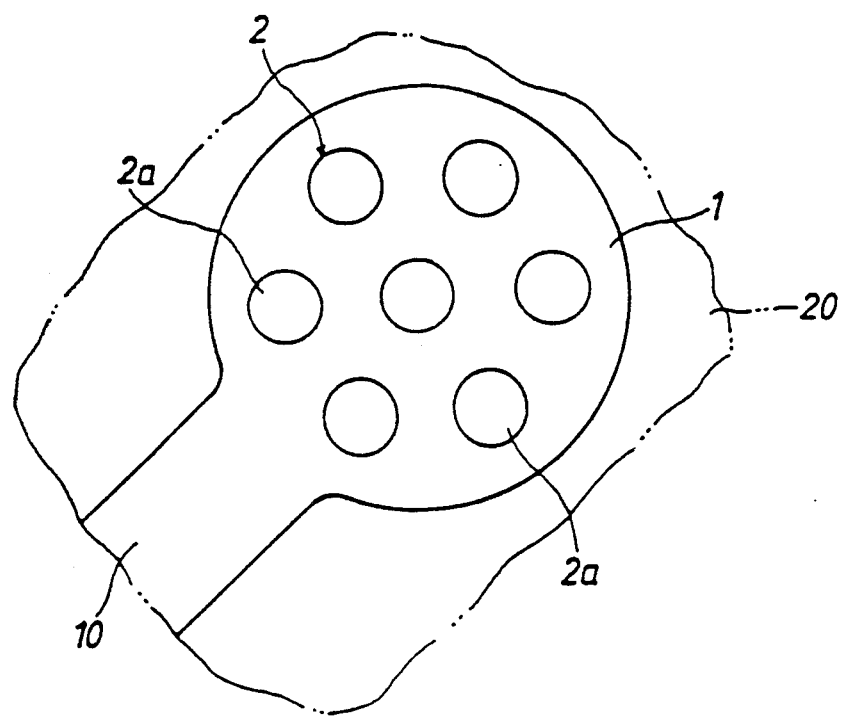
Figure 2A:
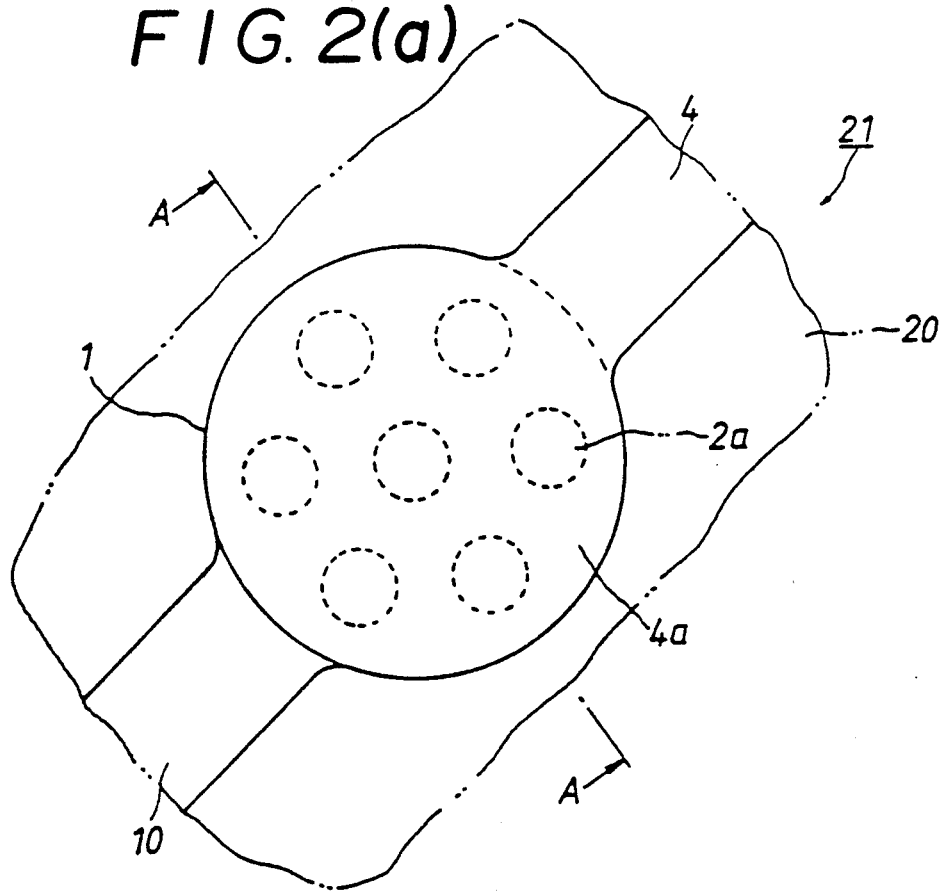
FIG. 2a is an enlarged plan view which illustrates a state where a jumper circuit is connected to the terminal portion.

FIGS. 1 and 2 are views which illustrate a first embodiment of the method of manufacturing a printed circuit board according to the present invention, wherein FIG. 1 is an enlarged plan view which illustrates a state in which a multi-dot coating layer of resin ink is formed on the surface of a terminal portion of a printed circuit, FIG. 2a is an enlarged plan view which illustrates a state where a jumper circuit is connected to the terminal portion, and FIG. 2b is a cross-sectional view taken along line A—A of FIG. 2a.

As shown in FIGS. 1 and 2 and according to the method of manufacturing a printed circuit board according to the present invention, when a circuit, for example, a jumper circuit 4, is intended to be formed in a terminal portion 1 of a printed circuit 10 formed on an insulating substrate 20, a coating layer 2 is, as shown in FIG. 1, formed on the surface of the terminal portion 1 prior to the forming of the jumper circuit 4. This coating layer 2 is formed in such a manner that a plurality of projections 2a that are made of, for example, resin ink of the electroconductive paste used for forming the jumper circuit 4 after its electroconductive components have been removed are applied thereto in a multi-dot configuration by means of printing or the like.

Then, the layout of the jumper circuit 4 is printed by using electroconductive ink, and thus the jumper circuit 4 whose terminal portion 4a is electrically connected to a terminal portion 1 is formed as a result of the hardening of the electroconductive ink.

The thus-formed jumper circuit 4 is protected by an insulating overcoat film 5 applied thereto.

The jumper circuit 4 of a printed circuit board 21 is, of course, formed after insulating films (omitted from illustration) have been previously formed on the surface of the portions thereof that must be insulated from other printed circuits 10 in terms of the relationship with the printed circuit 10.

Therefore, the number of manufacturing processes can be reduced by printing the coating layer 2 to which the projections 2a are applied in a multi-dot configuration on the surface of the terminal portion 1 simultaneously with the forming of the insulating coating to be applied to the upper surface of the printed circuit 10, this forming of the insulating coating being, in general, performed prior to the forming of the circuits such as the jumper circuit 4. That is, the number of manufacturing processes can be reduced by performing the above-described printing simultaneously with the silk-printing of insulating resin for the purpose of forming the insulating coating. As for the resin ink used in this case, the projections 2a are, of course, formed by the resin ink used for forming the insulating coating.

The coating layer 2 applied to the terminal portion 1 realizes a state where the surface of the terminal is partially covered with a plurality of the projections 2a applied thereto and the other portion of this surface appears.

As described above, in the method of manufacturing a printed circuit board according to the present invention, when circuits such as a jumper circuit 4 are formed after the printed circuit 10 has been formed, the jumper circuit 4 or the like is formed by applying electroconductive ink after resin ink has been applied on part of the terminal surface of the terminal portion 1 by utilizing the excellent contact capability of the normal resin ink with both metallic surfaces and electroconductive ink.

A second embodiment according to the present invention is also described with reference to FIGS. 1 and 2. The difference with the first embodiment lies in the fact that the portions of the printed circuit 10 except for the terminal portion 1 are covered with the insulating coating layer, and the coating layer 2 which applies a plurality of projections 2a thereof to the surface of the terminal portion 1 in a multi-dot configuration is formed. The other factors are the same as those of the first embodiment, therefore, description of them is omitted here.

Figure 4A:
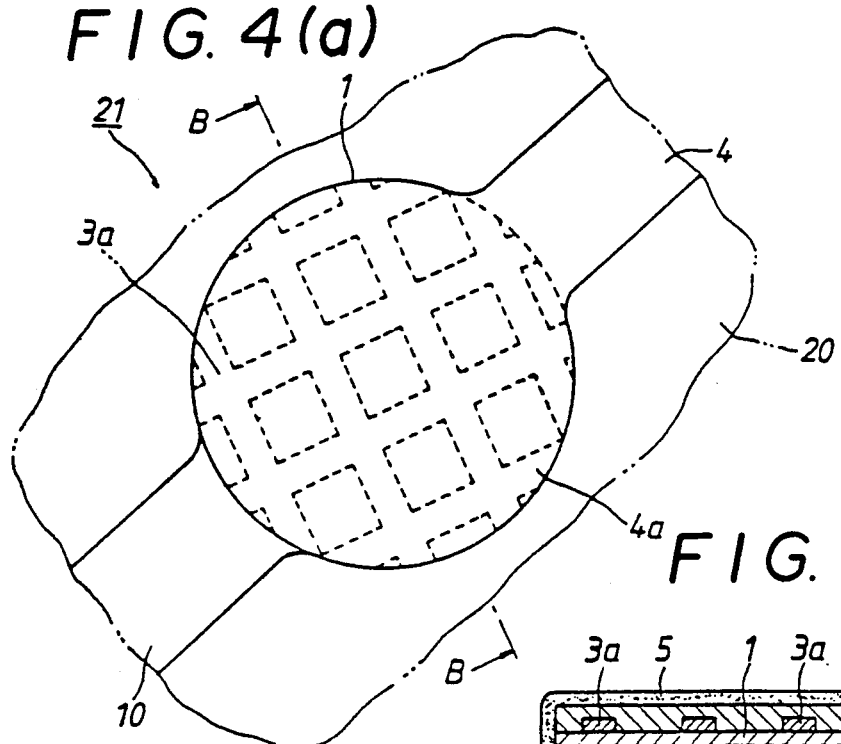
FIG. 4a is an enlarged plan view which illustrates a state where a jumper circuit is formed in the terminal portion.
Figure 4B:
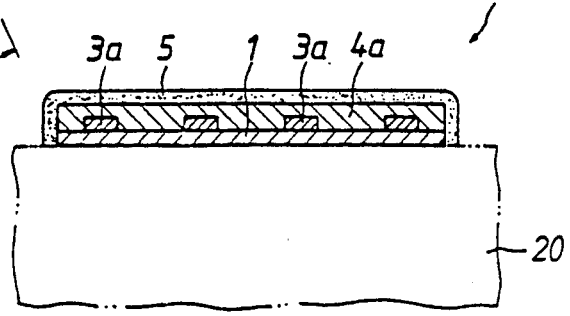
Figure 5:
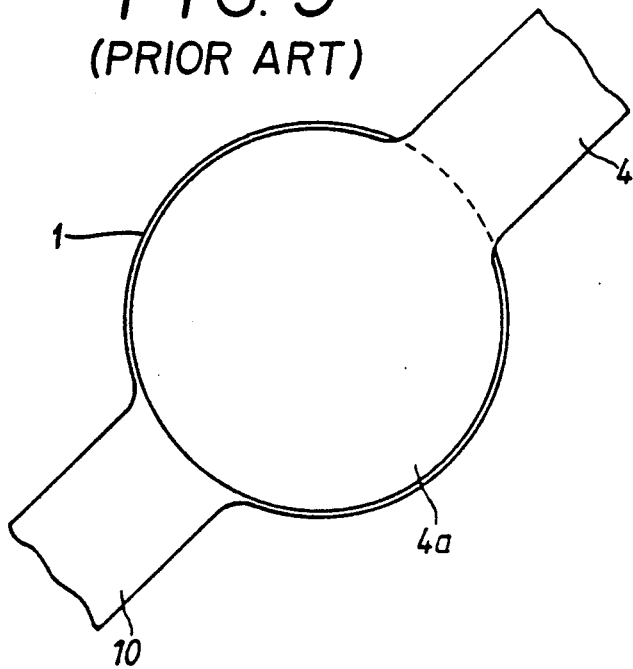
FIG. 5 is a partial enlarged view which illustrates the conventional connection established between the surface of a terminal and a jumper circuit of electroconductive ink.

FIGS. 3 and 4 are views which illustrate a second embodiment of a method of manufacturing a printed circuit board according to the present invention, wherein FIG. 3 is an enlarged plan view which illustrates a terminal portion, FIG. 4a is a view which illustrates a state where a jumper circuit is formed in the terminal portion, and FIG. 4b is a cross-sectional view taken along line B—B of FIG. 4a.

As an alternative to the coating layer 2 in a multi-dot configuration according to the first embodiment, the third embodiment of the method of manufacturing a printed circuit board is characterized in that a coating layer 3 in the form of a net 3a is applied to the terminal surface of the terminal portion 1 of the printed circuit 10 by means of silk printing of resin ink or the like.

Then, the jumper circuit 4 is formed by the same manner as that of the first embodiment.

The other factors of the manufacturing method are the same as those of the first embodiment, thus description of them is omitted, with the same components given the same reference numerals.

According to the method of manufacturing a printed circuit board of the present invention, peeling between the terminal surface and the electroconductive paste applied to the connection portion such as the jumper circuit can be prevented and defects in the printed circuit boards can be surely prevented by applying the circuits such as the jumper circuit made of electroconductive ink to the terminal portion of the printed circuit after resin ink has been applied to the terminal surface in the form of a net or in a multi-dot configuration.

What is claimed is:

1. A method of manufacturing a printed circuit board, comprising the steps of: forming a printed circuit with a terminal portion on an insulating substrate, forming another printed circuit by applying electroconductive ink on the insulative substrate and on the terminal portion of said printed circuit, and prior to applying said electroconductive ink, covering a portion of a terminal surface of said terminal portion of said printed circuit with resin ink in a pattern of raised resin ink projections to improve the mechanical and electrical connection between the electroconductive ink and the terminal portion.

2. A method of manufacturing a printed circuit board according to claim 1, wherein said portion of said terminal surface of said terminal portion to be connected with electroconductive ink is covered with resin ink simultaneously with the forming of an insulating layer on the printed circuit.

3. A method of manufacturing a printed circuit board according to claim 1, wherein said terminal surface of said terminal portion comprises a coating layer formed by applying resin ink in a net-dot configuration.

4. A method of manufacturing a printed circuit board according to claim 1 or 2, wherein said terminal surface of said terminal portion comprises a coating layer formed by applying resin ink in a multi-dot configuration.

5. A method of producing a printed circuit board, comprising the steps of:
    forming a printed circuit with at least one terminal portion on an insulating substrate;
    covering a portion of a surface of the at least one terminal portion with a resin ink in a pattern of raised resin ink projections; and thereafter connecting the printed circuit to another printed circuit by applying electroconductive ink on the substrate and on the surface of the at least one terminal portion including said portion of the surface covered by the resin ink whereby the resin ink improves the mechanical and electrical connection between the at least one terminal portion and the electroconductive ink.

6. The method according to claim 5; wherein the step of covering comprises simultaneously applying an insulating layer on the printed circuit and covering the portion of the surface of the at least one terminal portion.

7. The method according to claim 5 or 6; wherein the step of covering comprises applying the resin ink on the portion of the surface of the at least one terminal portion in a dot pattern.

8. The method according to claim 5 or 6; wherein the step of covering comprises applying the resin ink on the portion of the surface of the at least one terminal portion in a net pattern.

9. A method of producing a printed circuit board, comprising the steps of: forming a printed circuit having at least one terminal portion on an insulating substrate; covering a portion of a surface of the terminal portion with an insulating resin ink in a pattern of raised resin ink projections while leaving exposed the surface of the terminal portion between the raised resin ink projection to improve the connection strength between the terminal portion and an electroconductive ink applied on the terminal portion, while simultaneously forming an insulating layer on the printed circuit; and thereafter connecting the printed circuit to another printed circuit by applying electroconductive ink on the substrate, on the exposed surface of the terminal portion, and on the raised resin ink projections, to form an electrical and mechanical connection between the exposed surface of the terminal portion and the other printed circuit.

10. A method according to claim 9; wherein the step of covering comprises applying the resin ink on the portion of the surface of the terminal portion in a dot pattern.

11. A method according to claim 9; wherein the step of covering comprises applying the resin ink on the portion of the surface of the terminal portion in a net pattern.

* * * * *